United States Patent [19]
George et al.

[11] Patent Number: 5,439,162
[45] Date of Patent: Aug. 8, 1995

[54] DIRECT CHIP ATTACHMENT STRUCTURE AND METHOD

[75] Inventors: Reed A. George, Lake Worth; John P. Cheraso, Boynton Beach; Douglas W. Hendricks, Boca Raton, all of Fla.

[73] Assignee: Motorola, Inc., Schaumburg, Ill.

[21] Appl. No.: 82,568

[22] Filed: Jun. 28, 1993

[51] Int. Cl.⁶ .................................. H05K 3/34
[52] U.S. Cl. ................. 228/180.22; 228/207; 228/254
[58] Field of Search ............ 228/180.22, 207, 223, 228/224, 254

[56] References Cited

U.S. PATENT DOCUMENTS 3,960,279  6/1976  Hartleroad et al. ............ 228/180.21
4,893,403  1/1990  Heflinger et al. ............... 29/840

OTHER PUBLICATIONS

Payne, *FPT—A Step In The Right Direction*, Circuits Assembly, Feb. 1993, 59–64.

Curtin, *Solder Paste Printing—The Micro-Mechanics*, Circuits Assembly, Aug. 1992, 42–44.

Heimsch, *UFP Printing—Ultrafine-Pitch Solder Paste Printing*, Circuits Assembly, Jan. 1992, 32–37.

*Primary Examiner*—Samuel M. Heinrich
*Attorney, Agent, or Firm*—D. Andrew Floam; Michael J. DeLuca

[57] ABSTRACT

An integrated circuit (70) is soldered to a printed circuit board (200) by first depositing flux (116) on bumps (75) of the integrated circuit. Solder (214) is deposited upon the bumps (75), and the integrated circuits is (70) placed in contact with pads (210) on the printed circuit board (200). After reflow, a solder joint (230) electrically and mechanically attaches the integrated circuit (70) to the printed circuit board (200).

Alternatively, the solder tipped (214) bumps (75) may be placed in contact with a non-adhering flat plane (300) such as glass during the heating process. After reflow, each bump has a flat portion (350), and the flat portions of all the bumps form a plane (400) which further facilitates attaching the integrated circuit (70) to the printed circuit board (200).

14 Claims, 3 Drawing Sheets

DIRECT CHIP ATTACHMENT STRUCTURE AND METHOD

FIELD OF THE INVENTION

This invention relates generally to physically and electrically attaching an integrated circuit to another circuit. More specifically, the invention relates to an integrated circuit having a solder compound applied for attaching the integrated circuit to another circuit, and a method of producing the same.

BACKGROUND OF THE INVENTION

In the continuing evolution of miniature electrical circuits, a technology named Direct Chip Attachment (DCA) has emerged. DCA refers to directly attaching an integrated circuit (chip) to another circuit such as a printed circuit board. This has the advantage of eliminating the cost of separately packaging the integrated circuit into a carrier before attaching the carrier to a printed circuit board. Another advantage in the elimination of the carrier is the reduction in the surface area necessary to realize an entire circuit. The reduction in surface area is important in the constant push towards ever smaller electronic devices. Such devices include radios, televisions, personal computers, portable telephones, and paging receivers.

In a prior art method of DCA, a printed circuit board (PCB) has metal runners which form conductive paths for circuits on the PCB. The metal runners may typically be made of copper. Pads are formed from the metal runners and are provided for soldering an integrated circuit to the PCB. DCA has been accomplished by depositing a eutectic solder which may consist of a 60% tin and 40% lead on the pads. The general area of the deposited solder is next coated with a liberal amount of solder flux.

Then, an integrated circuit (IC) having bumps is attached to the PCB. The IC has a multiplicity of bumps, the bumps being formed in the IC manufacturing process to provide both electrical and mechanical connection to the PCB. The IC may have anywhere from less than eight to over one hundred and forty bumps depending upon the requirements of the circuitry. The bumps may range in diameter between 2 and 6 mils (0.5 and 1.6 mm) and may be spaced a distance of substantially 5 mils (1.2 mm) or more apart. Each bump is substantially spherical and may consist of a 5% tin and 95% lead compound. This compound gives the bumps a substantially higher melting point than the melting point of the solder used for attaching the IC to the PCB. The pads on the PCB are positioned such that they correspond to the locations of the bumps on the IC.

The IC is then reflow soldered to the PCB by heating the eutectic solder above its melting point. After cooling, both an electrical and a mechanical solder bond is formed between each bump and corresponding pad, thereby attaching the IC to the PCB by melted solder joints.

Because of the very small spacing between the pads, aligning a mask and depositing solder on the pads is an expensive and difficult process. Furthermore, defects in the deposition process may result in either excess or insufficient solder on the PCB which can result in either solder shorts or opens thereby resulting in defective operation and requiring repair of the circuit. For at least these reasons, it is desirable to eliminate the process of depositing eutectic solder on the PCB.

Furthermore, since the alignment of the flux is not critical to the integrity of the solder process, the area of the PCB around the IC is liberally covered with excess flux. This results in residual flux on the PCB. In a subsequent underfilling process, the attached IC and the immediately surrounding PCB area is covered with an epoxy coating which underfills the IC and both protects the IC from the external environment and provides additional mechanical support. If the flux remains on the PCB, the integrity of the underfilling process may be compromised by flux residue at the epoxy to PCB interface. Otherwise, removal of the flux before underfilling necessitates an additional time and expense of a cleaning process. For at least these reasons, it is desirable to improve the underfilling process by eliminating the creation of residual flux.

SUMMARY OF THE INVENTION

In accordance with the invention, a method for use in attaching an integrated circuit having a multiplicity of bumps for soldering the integrated circuit to another circuit comprises the step of depositing solder upon the integrated circuit bumps prior to attaching the integrated circuit to the other circuit.

In accordance with the invention, an integrated circuit comprises a multiplicity of bumps for attaching the integrated circuit to another circuit and solder deposited upon each of said bumps for attaching the integrated circuit to another circuit.

DESCRIPTION OF THE INVENTION

Figure 1:
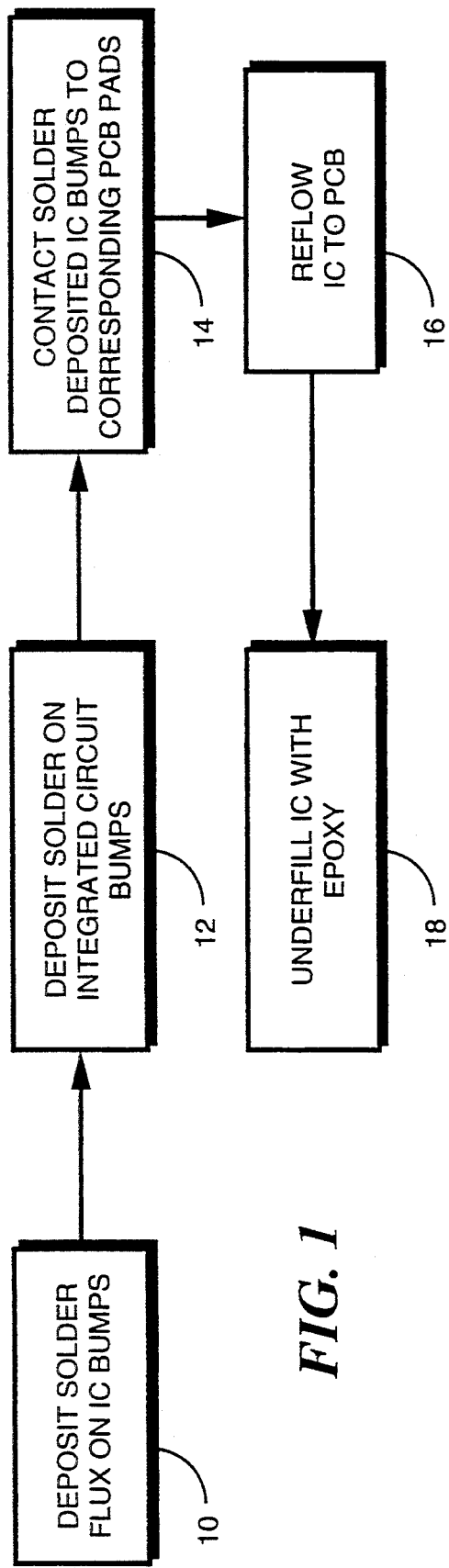
FIG. 1 shows a process flow chart in accordance with a preferred embodiment of the present invention.
Figure 3:
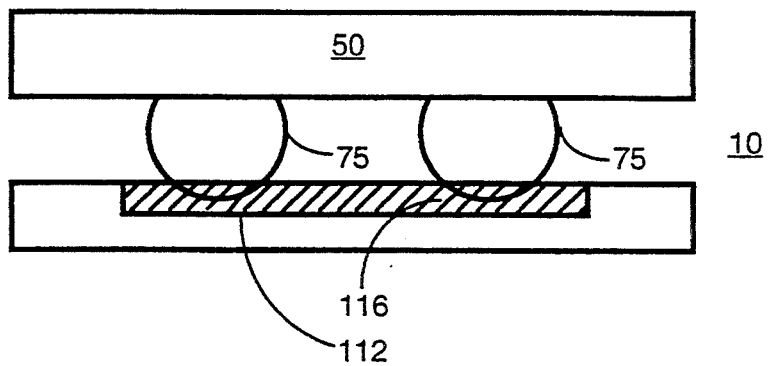
FIG. 3 shows the bumps of an integrated circuit being dipped into a well of solder flux in accordance with a preferred embodiment of the present invention.

FIG. 1 shows a process flow chart in accordance with a preferred embodiment of the invention. In the first step 10, solder flux is deposited on bumps on an integrated circuit. Referring to FIG. 3, the integrated circuit (IC) 50 has a multiplicity of bumps 75, the bumps being formed in the IC manufacturing process to provide both electrical and mechanical connection to a printed circuit board (PCB). The IC 50 may have anywhere from less than eight to over one hundred and forty bumps 75 depending upon the requirements of the circuitry. The bumps may range in diameter between substantially 2 and 6 mils (0.5 and 1.6 mm) and may be spaced a distance of substantially 5 mils (1.2 mm) or more apart. Each bump is substantially spherical and may consist of a 5% tin and 95% lead compound. FIG. 3 shows the bumps 75 of IC 50 being dipped into a well 112 of solder flux 116. This step serves the function of depositing flux on the bumps. When the bumps are dipped into the flux, flux adheres to the portion of each bump dipped into the flux.

Figure 4:
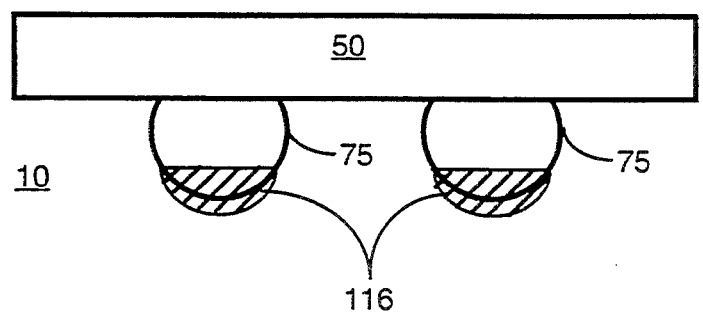
FIG. 4 shows the bumps partially covered with flux in accordance with a preferred embodiment of the present invention.

Next in the flux depositing process 10 of FIG. 1, the IC bumps are removed from the flux well. Referring to FIG. 4, FIG. 4 shows bumps 75 partially covered with flux 116 after removal from the flux well. The amount of flux coverage on a bump depends upon the depth of the dipping of the bumps into the flux well 112. The coverage is preferably 1 mil (0.3 mm). For reasons that will become apparent, the ability to adjust the flux coverage is advantageous. Adjusting the flux coverage may be realized by either adjusting the depth of the well and then allowing the bumps to contact the bottom of the well, or regulating the depth of dipping. For example, less than 1 mil (0.3 mm) of flux coverage may be realized by decreasing the depth of dipping, alternately the depth of dipping may be increased to cover up to substantially the entire bump with flux.

Figure 5:
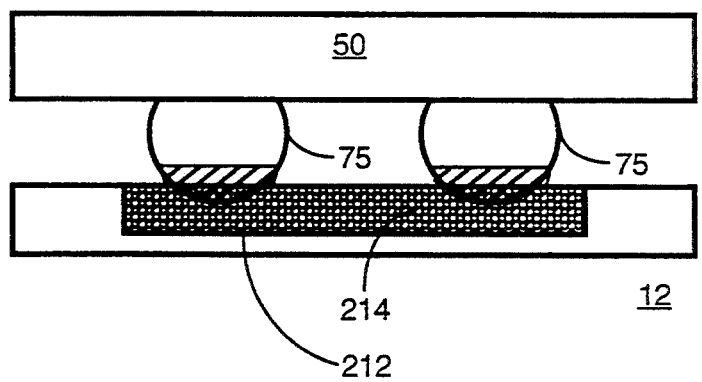
FIG. 5 shows the dipping of the flux coated bumps into a well of solder compound in accordance with a preferred embodiment of the present invention.

Referring now to step 12 of FIG. 1, solder is deposited upon each IC bump. In a preferred embodiment, solder adheres to the flux deposited in step 10: In a alternate embodiment, a solder compound may be directly deposited on each bump. Referring to FIG. 5, FIG. 5 shows the dipping of the partially flux covered bumps 75 into a well 212 of solder compound 214. Preferably, the room temperature solder compound consists of 60% tin and 40% lead having a mesh of four hundred or less eutectic particles. During the dipping process, the solder adheres substantially only to the flux covered portion of each bump.

Figure 6:
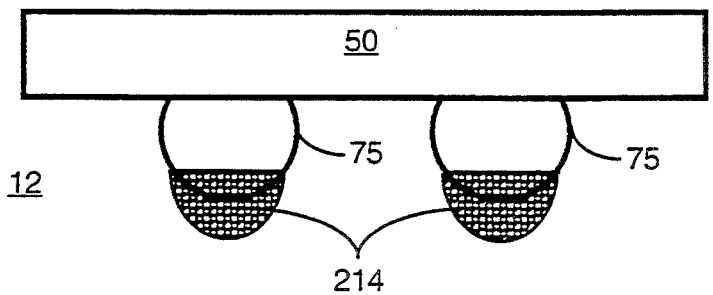
FIG. 6 shows the solder compound adhering to the flux and not adhere to the bumps or the integrated circuit in accordance with a preferred embodiment of the present invention.

Next in the solder depositing process 12 of FIG. 1, the IC bumps are removed from the solder well 212. Referring to FIG. 6, FIG. 6 shows the solder compound 214 adhering to the flux and not adhering to either the uncovered portions bumps 75 or the integrated circuit 50. As a result of this step, a multiplicity of bumps, each bump being partially coated with a solder portion is formed. Note that the resulting solder deposits 214, functionally correspond to the prior art method of selectively depositing solder on a PCB followed by excess flux coverage. However, the requirement for an extra step of precise alignment of a mask for accurately depositing the solder on PCB pads has been eliminated. The alignment necessary to dip the partially flux coated bumps in flux well 112 and solder well 212 requires substantially less precision than the prior art alignment required for depositing solder on the PCB.

Since the solder substantially only adheres to the flux, this method has the further advantage of reducing the probability of a solder short due to excess solder either between bumps or contacting other parts of the circuit Another advantage is that the amount of solder deposited on each bump may be adjusted. Recall from step 10 that the amount of flux coverage may be adjusted; since the solder adheres substantially only to the flux, the amount of solder deposited on each bump may be adjusted by adjusting the flux coverage. The amount of solder is important in the integrity of the electrical and mechanical attachment of the IC to the PCB. If too little solder is present, a weak joint with poor electrical conductivity may result, while if too much solder is present, solder shorts between a bump and other conductive electrical paths of the circuit may result. Thus, the invention has the advantage of both eliminating a costly PCB solder deposition process and providing for the adjustment of the amount of solder deposited upon each bump.

Figure 7:
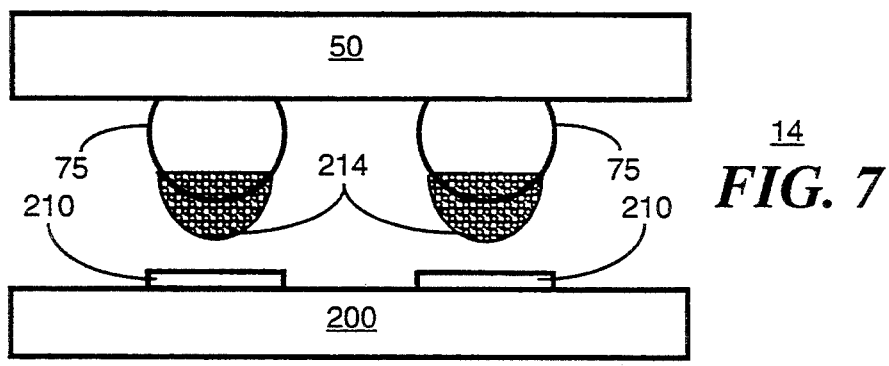
FIG. 7 shows the partially solder coated bumps of the integrated circuit being placed in contact with corresponding pads of the printed circuit board in accordance with a preferred embodiment of the present invention.

Next in step 14 of FIG. 1 the IC is placed in contact with a PCB by placing the solder deposited bumps in contact with corresponding pads on the PCB. Referring also to FIG. 7, FIG. 7 shows a PCB 200 having metal runners which form conductive paths for the circuit on the PCB. The metal runners may typically be made of copper. Pads 210 are formed from the metal runners, and have locations on the PCB which correspond to the location of the bumps 75 on IC 50. Pads 210 are provided for soldering IC 50 to PCB 200. FIG. 7 shows the partially solder coated 214 bumps 75 of IC 50 being placed in contact with corresponding pads 210 of PCB 200.

Figure 8:
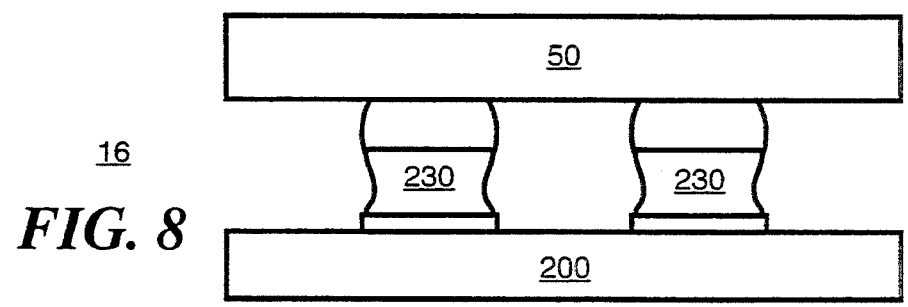
FIG. 8 shows the integrated circuit electrically and mechanically attached to the printed circuit board by melted solder joints in accordance with a preferred embodiment of the present invention.

Referring next to step 16 of FIG. 1, the IC is reflow soldered to the PCB. In this step, solder 214 is heated above its melting point. Because of their relative compositions, the melting point of solder 214 is substantially lower than the melting point of each bump 75. As a result of cooling, each bump 75 is reflowed to a corresponding pad 210. Referring also to FIG. 8, FIG. 8 shows the IC electrically and mechanically attached to the PCB by solder joints 230.

Finally, step 18 of FIG. 1 shows an epoxy underfill step. In step 18, the attached IC and the immediately surrounding PCB area is covered with an epoxy coating which fills the gap between the IC and the PCB, thereby both protecting the IC from the external environment and providing additional mechanical support. Since flux coating 116 is sufficient for the soldering process, no excess flux is used. Thus, the process has substantially eliminated the prior art problem of residual flux on the PCB. The elimination of excess flux has the advantages of eliminating any need for a flux cleaning process and improves the subsequent epoxy underfill process.

Figure 2:
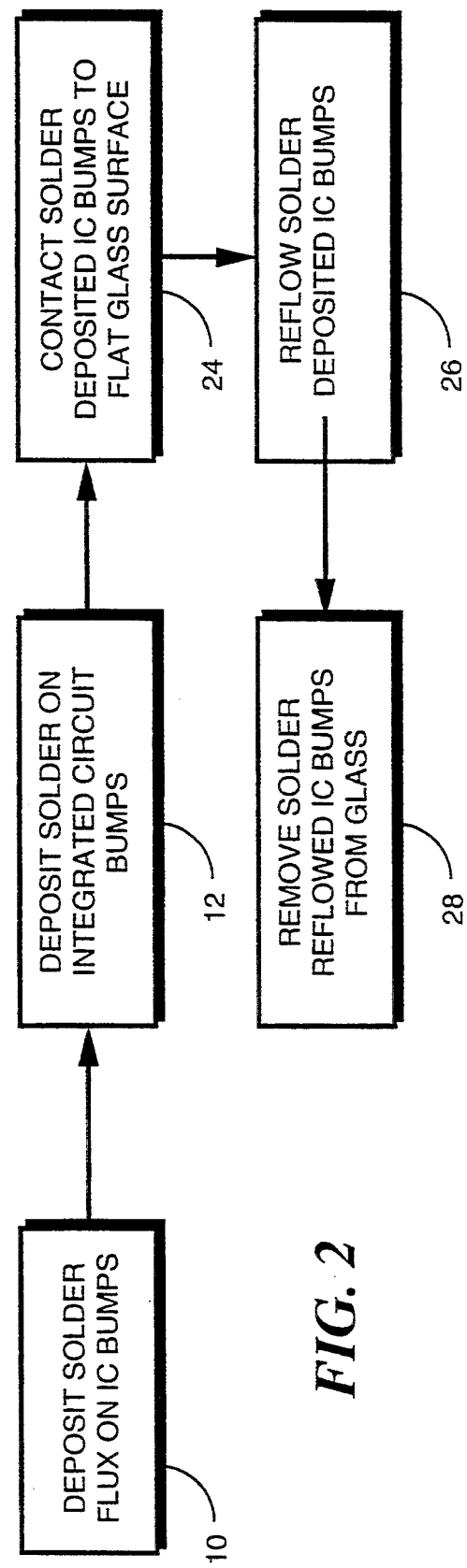
FIG. 2 shows a process flow chart in accordance with the invention.
Figure 9:
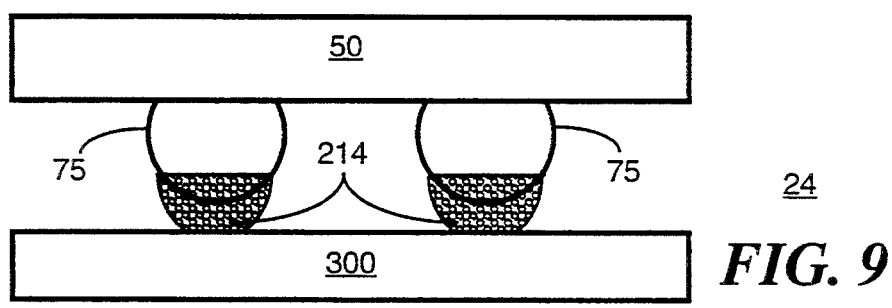
FIG. 9 shows the integrated circuit bumps partially coated with solder placed in contact with a non-adhering flat surface in accordance with an alternate embodiment of the present invention.

FIG. 2 shows an alternate process flow chart in accordance with the invention. Steps 10 and 12 of FIG. 2 correspond to Steps 10 and 12 of FIG. 1 as well as FIGS. 3 through 6. As a result of these steps, solder is deposited upon the bumps of the IC. Then, in step 24 the solder tipped IC bumps are placed in contact with a flat non-adhering surface. Referring also to FIG. 9, FIG. 9 shows the IC bumps 75 partially covered with solder 214 of FIG. 6 being placed in contact with a non-adhering flat surface 300. Flat surface 300 may be made of a glass to which the solder does not substantially bond either before, during or after heating beyond its melting point. Then in step 26 of FIG. 2, the solder is heated, thereby reflowing the solder deposited upon the IC bumps. After heating, IC 50 is removed from flat surface 300, step 28 FIG. 2. This results in the bumps being solder tipped and having flat portions formed by contact with the flat surface.

Figure 10:
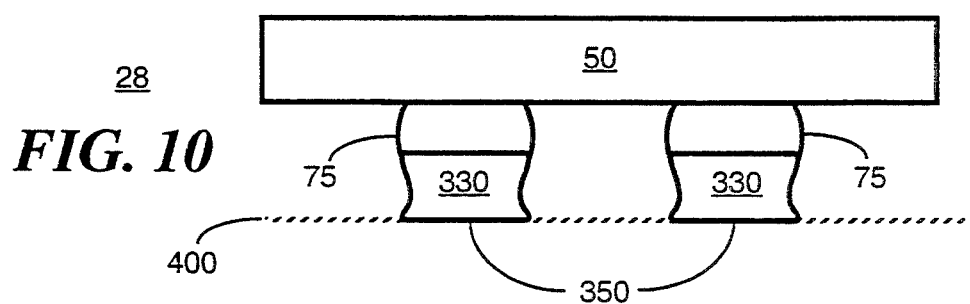
FIG. 10 shows solder deposited on a portion of a bump, wherein each bump has a flat portion and the flat portions of the bumps form a plane in accordance with an alternate embodiment of the present invention.

FIG. 10 shows solder 330 deposited on a portion of each bump 75, wherein each bump has a flat portion 350 and wherein the flat portions of the bumps form a plane 400. Since the plane of IC 50 is substantially parallel to the flat plane 300, the plane 400 of the flat portions 330 is substantially parallel to the plane of the IC 50.

Thereafter, the IC may be attached to a PCB by again heating the solder beyond its melting point while in contact with the PCB pads. This process may be further facilitated by again using either a flux deposition process or a solder deposition process or both on the bumps of FIG. 10. Alternately, the process may be further facilitated with a prior art method of an additional coating of either: flux, deposited solder, or both flux and deposited solder on the PCB prior to attaching the IC to the PCB.

The structure shown in FIG. 10 has several advantages. First, the use of flat plane 300 compensates for differences in any height between the bumps 75 introduced by either the bump fabrication process or either the flux or solder deposition processes. Also, since the solder deposited on the bumps has been reflowed, the structure is more robust than the non-reflowed solder of FIG. 6. Thus, the IC of FIG. 10 may more readily be transported to other production facilities for use in a final circuit. This robust aspect makes an IC in this stage more marketable to circuit manufacturers who desire to use ICs in direct chip attachment (DCA) applications. Consequently the method and structure shown in FIG. 10 may be included in the IC fabrication process.

In still another advantage, users of either IC of FIGS. 6 or 10 are relieved of the expensive process of precise deposition of solder on a PCB. This is true whether or not plane 400 is formed. Since pads 210 of PCB 200 form a corresponding substantially flat plane, plane 400 formed by flat portions 350 has the further advantage of facilitating the attachment of the IC to the PCB. This results in an improved IC for use in DCA applications, the IC having a robust and adjustable solder deposit formed into a flat plane which may be easily accepted by a corresponding flat plane of a PCB.

We claim:

1. A method of attaching an integrated circuit to another circuit, the integrated circuit having a multiplicity of bumps attached directly to the integrated circuit for soldering the integrated circuit to the other circuit, each bump being substantially spherical and having a diameter ranging from substantially two to six mils, said method comprising the steps of:
   dipping the bumps into a flux compound to a depth of substantially one mil, wherein the flux compound adheres to a dipped portion of each bump; and
   dipping the bumps into an eutectic solder compound after said step of dipping the bumps into the flux compound, wherein the solder compound adheres to the flux compound and does not substantially adhere to the bumps or the integrated circuit, the multiplicity of bumps being partially covered with a solder portion.

2. The method according to claim 1 further comprising the steps of:
   affixing the solder portion of each of the bumps to a corresponding connector pad on the other circuit;
   heating the solder portion beyond a melting point of the solder compound after said step of affixing; and
   cooling the solder portion after said step of heating, wherein the cooled solder portion mechanically and electrically attaches the integrated circuit to the other circuit.

3. The method according to claim 1 further comprising the steps of:
   heating the solder portion beyond a melting point of the solder compound after said step of depositing;
   contacting the solder portion with a substantially planar non-adhering surface while the solder portion is heated beyond the melting point; and
   removing the substantially planar non-adhering surface after said step of heating thereby forming an integrated circuit having a multiplicity of bumps having solder deposited thereon, wherein each bump has a flat portion formed by removal of the substantially non-adhering planar surface and flat portions of the multiplicity of bumps are substantially planar.

4. A method for use in attaching an integrated circuit having a multiplicity of bumps to another circuit, said method comprising the step of:
   depositing solder upon the bumps prior to attaching the integrated circuit to the other circuit, wherein said step of depositing comprises the steps of:
   depositing solder flux on the bumps; and
   dipping the bumps into a solder compound, wherein the solder compound adheres to the deposited solder flux.

5. The method according to claim 4 wherein said step of depositing further includes the step of adjusting the amount of solder deposited upon the bumps comprising the step of dipping the bumps into the solder flux.

6. The method according to claim 5 wherein said step of adjusting the amount of solder deposited upon the bumps includes the step of adjusting a depth of dipping the bumps into the solder flux.

7. The method according to claim 4 wherein:
   each bump is substantially spherical having a diameter substantially between two and six mils and which consists substantially of five percent tin and ninety five percent lead and is attached directly to the integrated circuit, and
   the solder compound consists substantially of sixty percent tin and forty percent lead of four hundred mesh or less eutectic particles.

8. A method for use in attaching an integrated circuit having a multiplicity of bumps to another circuit, said method comprising the step of:
   depositing solder upon the bumps prior to attaching the integrated circuit to the other circuit;
   heating the solder beyond a melting point of the solder after said step of depositing; and
   cooling the solder after said step of heating and before attaching the integrated circuit to the other circuit.

9. The method according to claim 8 further comprising the step of forming a flat portion of solder on the bumps wherein the flat portions substantially form a plane.

10. The method according to claim 8 further comprising the steps of:
    contacting the solder deposited on the bumps with a substantially planar non-adhering surface means while the solder is heated beyond its melting point; and removing the substantially planar non-adhering surface means after said step of heating thereby forming an integrated circuit having a multiplicity of bumps having solder deposited thereon, wherein each bump has a flat portion formed by removal of the planar surface means and the flat portions of the multiplicity of bumps are substantially planar.

11. The method according to 10 wherein the substantially planar non-adhering surface means comprises glass.

12. The method according to claim 10 further comprising the step of:

attaching the integrated circuit to the other circuit by heating the solder above a melting point of solder and cooling the solder.

13. The method according to claim 12 wherein the other circuit includes copper conductors and the solder deposited upon each bump of the integrated circuit is attached directly to a corresponding copper conductor.

14. The method according to claim 12 wherein each of the multiplicity of bumps has a location and the other circuit includes a multiplicity copper conductors having locations corresponding to the location the multiplicity of bumps, and the method further includes the step of coating each of the copper conductors before said step of heating for facilitating said step of attaching.

* * * * *